(12) United States Patent
Huang et al.

(10) Patent No.: US 10,345,973 B2
(45) Date of Patent: Jul. 9, 2019

(54) CAPACITIVE SENSING FOR DETERMINING MASS DISPLACEMENT AND DIRECTION

(71) Applicant: Apple Inc., Cupertino, CA (US)

(72) Inventors: Mengshu Huang, Cupertino, CA (US); Patrick J. Au, Santa Clara, CA (US); Xingxing Cai, Santa Clara, CA (US); Yuta Kuboyama, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 58 days.

(21) Appl. No.: 15/209,692

(22) Filed: Jul. 13, 2016

(65) Prior Publication Data

US 2018/0018038 A1 Jan. 18, 2018

(51) Int. Cl.
*G06F 3/01* (2006.01)
*G06F 3/044* (2006.01)

(52) U.S. Cl.
CPC .............. *G06F 3/044* (2013.01); *G06F 3/016* (2013.01)

(58) Field of Classification Search
CPC .................................. G06F 3/016; G06F 3/044
See application file for complete search history.

(56) References Cited

U.S. PATENT DOCUMENTS

| | | | | |
|---|---|---|---|---|
| 5,872,408 A | * | 2/1999 | Rakov ................. | G01D 5/2412 310/168 |
| 2013/0009652 A1 | * | 1/2013 | Lu ........................ | G01D 5/2415 324/658 |
| 2014/0041452 A1 | * | 2/2014 | Westberg ............. | G01P 15/131 73/514.32 |
| 2015/0220148 A1 | * | 8/2015 | Gregorio ............... | G06F 3/016 340/407.2 |
| 2016/0377435 A1 | * | 12/2016 | Ono .................... | G01C 19/5726 73/504.12 |

\* cited by examiner

*Primary Examiner* — Amr A Awad
*Assistant Examiner* — Stephen A Bray
(74) *Attorney, Agent, or Firm* — Fish & Richardson P.C.

(57) ABSTRACT

A capacitive sensing system for determining mass displacement and direction is disclosed. In an embodiment, a capacitive sensing system for sensing mass displacement and direction comprises: a mass; a periodic drive electrode pattern formed on or attached to the mass; a sensing electrode array positioned relative to the periodic electrode pattern, the sensing electrode array operable to sense a capacitance in an overlapping area between the periodic drive electrode pattern and the sensing electrode array; and a capacitive sensing circuit coupled to at least the sensing electrode array, the capacitive sensing circuit operable to generate a periodic signal based on the sensed capacitance, to determine a phase shift in the periodic signal in response to the periodic drive electrode pattern moving relative to the sensing electrode array, and to determine, based on the phase shift, a displacement and direction of the mass on a movement axis.

20 Claims, 9 Drawing Sheets

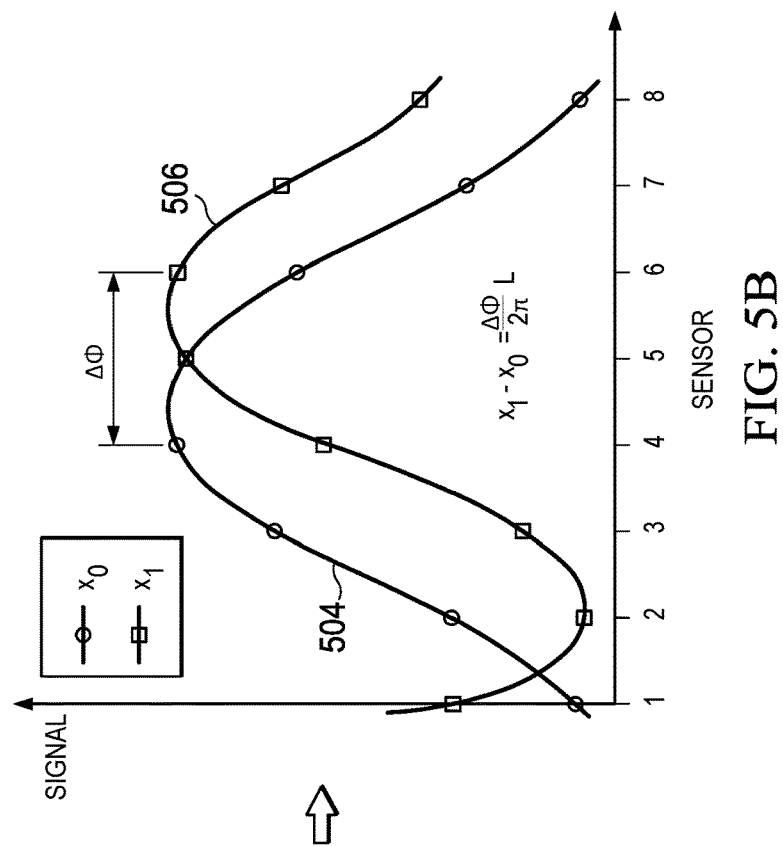
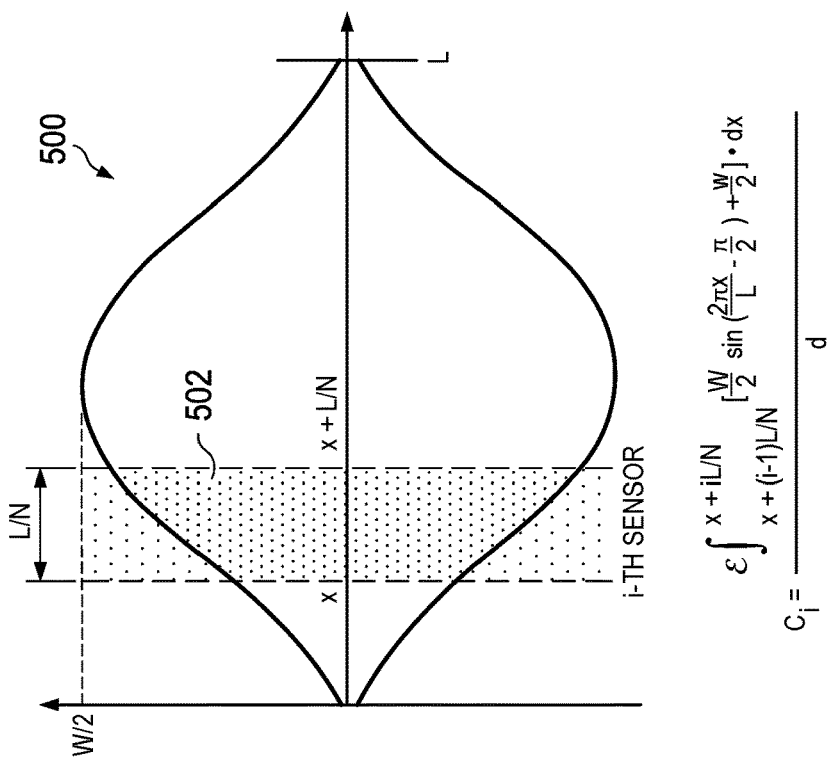
FIG. 5A
FIG. 5B

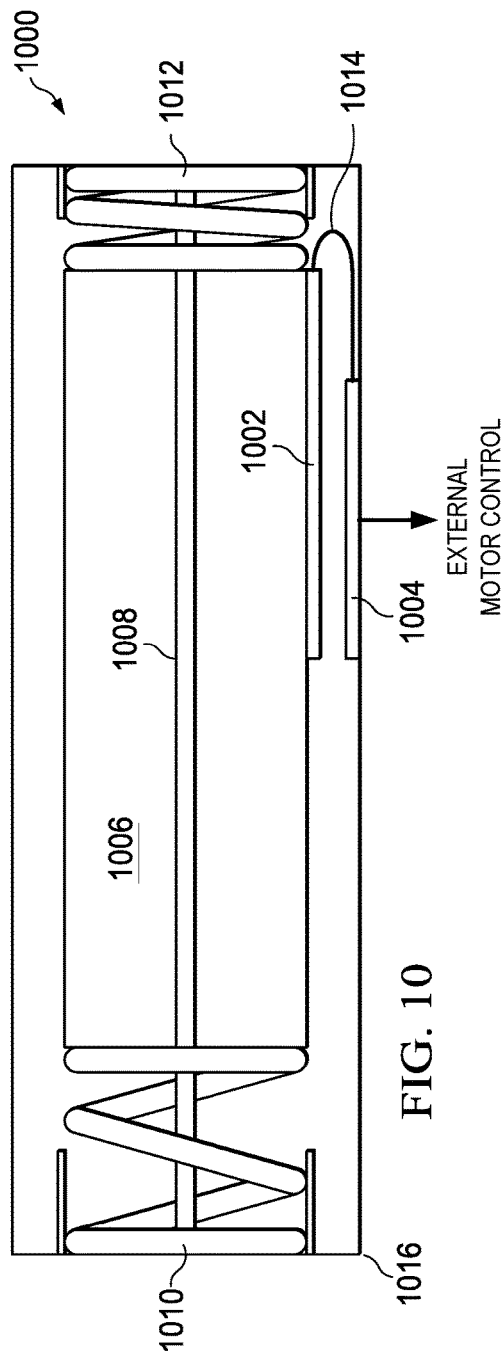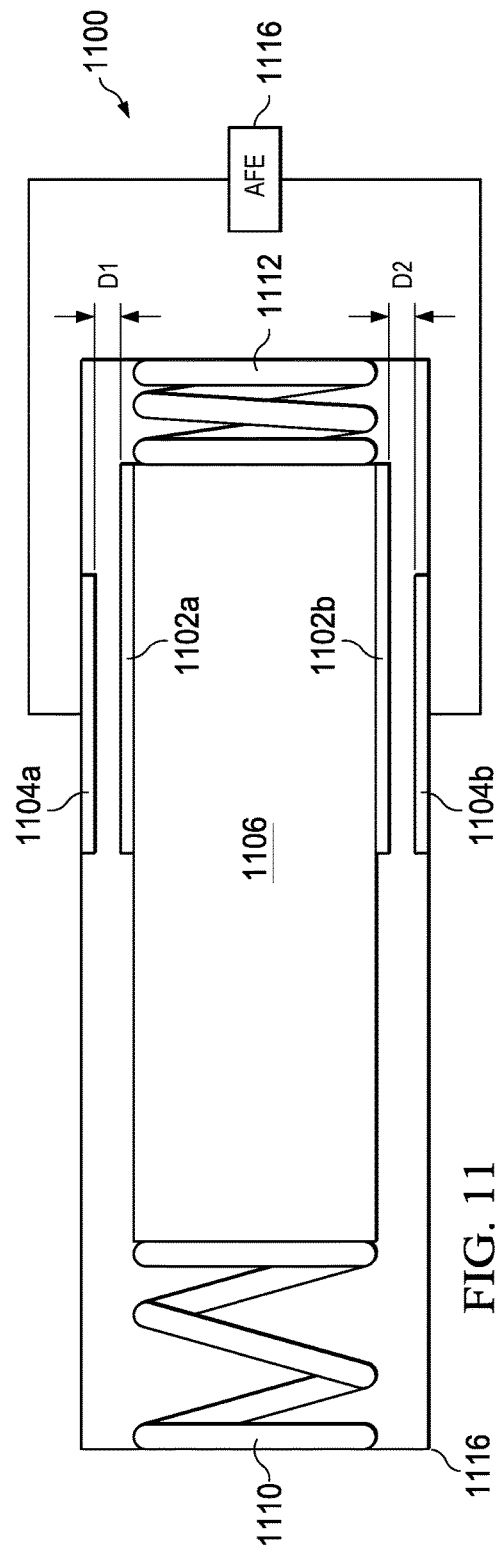

CAPACITIVE SENSING FOR DETERMINING MASS DISPLACEMENT AND DIRECTION

TECHNICAL FIELD

This disclosure relates generally to capacitive sensing systems.

BACKGROUND

Mobile devices often include a haptic system that is configured to provide a tactile feedback sensation such as a vibration or other physical sensation to a user touching or holding the mobile device. The haptic system can include an input surface and one or more actuators, such as piezoelectric transducers, electromechanical devices, and/or other vibration inducing devices, that are mechanically connected to the input surface. Drive electronics coupled to the one or more actuators cause the actuators to induce a vibratory response into the input surface, providing a tactile sensation to a user touching or holding the device. A conventional haptic system may include a mass in a housing that moves or oscillates to induce the vibratory response. A transducer can be included in the housing that varies its output voltage in response to changes in a magnetic field as the mass moves within the housing. The output voltage can be used in a control application to determine the position of the mass which can be used by the control application to provide stability to the haptic system.

SUMMARY

A capacitive sensing system and method for determining mass displacement and direction is disclosed.

In an embodiment, a capacitive sensing system for sensing mass displacement and direction comprises: a mass; a periodic drive electrode pattern formed on or attached to the mass; a sensing electrode array positioned relative to the periodic electrode pattern, the sensing electrode array operable to sense a capacitance in an overlapping area between the periodic drive electrode pattern and the sensing electrode array; and a capacitive sensing circuit coupled to at least the sensing electrode array, the capacitive sensing circuit operable to generate a periodic signal based on the sensed capacitance, to determine a phase shift in the periodic signal in response to the periodic drive electrode pattern moving relative to the sensing electrode array, and to determine, based on the phase shift, a displacement and direction of the mass on a movement axis.

In an embodiment, a method for sensing mass displacement and direction comprises: sensing, by a sensing electrode array, capacitance in an overlapping area between a drive electrode or a periodic drive electrode pattern formed on or attached to a mass and at least one sensing electrode array; generating at least one periodic signal indicative of mass motion; determining at least one phase shift in the at least one periodic signal; and determining, based on the at least one phase shift, at least one displacement and at least one direction of the mass on at least one movement axis.

In an embodiment, a capacitive sensing system for sensing mass displacement and direction comprises: a mass having a surface with a two-dimensional periodic drive electrode pattern formed on or attached to the surface; a first sensing electrode array positioned relative to the periodic electrode pattern, the first sensing electrode array operable to sense a first capacitance associated with a first overlapping area between the periodic drive electrode pattern and the first sensing electrode array; a second sensing electrode array positioned relative to the periodic electrode pattern, the second sensing electrode array operable to sense a second capacitance associated with a second overlapping area between the periodic drive electrode pattern and the second sensing electrode array; and a capacitive sensing circuit coupled to the at least one of the first and second sensing electrode arrays, the capacitive sensing circuit operable to generate periodic signals based on the sensed capacitance, to determine phase shifts in the periodic signals due to the periodic drive electrode pattern moving relative to the sensing electrode arrays, and to determine, based on the phase shifts, displacements and directions of the mass on two or more movement axes.

In an embodiment, a capacitive sensing system for sensing mass movement and direction comprises: a movable mass; a drive electrode formed on or attached to the mass; a sensing electrode array positioned relative to the drive electrode and operable to sense capacitance in an overlapping area between the drive electrode and the sensing electrode array; and a capacitive sensor coupled to the sensing electrode array and operable to determine a centroid of a capacitance distribution across a number of sensing electrodes of the sensing electrode array, to compute a shift in location of the centroid along the sensing electrode array due to the mass moving relative to the sensing electrode array, and determining, based on the centroid shift, a displacement and direction of the mass on a movement axis.

In an embodiment, a haptic system comprises: a housing; a movable mass fixed in the housing and operable to move within the housing on a movement axis, one or more drive electrodes or periodic drive electrode patterns formed on or attached to the mass; one or more sensing electrode arrays positioned in the housing relative to the drive electrode or drive periodic electrode pattern, the one or more sensing electrode arrays operable to sense capacitance in one or more overlapping areas between the drive electrode or periodic drive electrode pattern and the one or more sensing electrode arrays; and a capacitive sensing circuit coupled to at least one of the sensing electrode arrays, the capacitive sensing circuit operable to generate one or more periodic signals based on the sensed capacitance, to determine one or more phase shifts in the one or more periodic signals in response to the drive electrode or the periodic drive electrode pattern moving relative to the one or more sensing electrode arrays, and to determine, based on the one or more phase shifts, a displacement and direction of the mass on one or more movement axes.

Particular embodiments disclosed herein provide one or more of the following advantages. The capacitive sensing system and method disclosed herein is environment robust, easy to implement and cost effective. The capacitive sensing system does not require a sealed environment to prevent rust, light or other leakage. The capacitive sensing system does not require a special mass or sensing electrode design.

The details of the disclosed embodiments are set forth in the accompanying drawings and the description below. Other features, objects and advantages are apparent from the description, drawings and claims.

DESCRIPTION OF DRAWINGS

FIGS. 5A and 5B illustrate an example calculation of mass displacement and direction for a single movement axis using capacitive sensing, according to an embodiment.

FIG. 10 illustrates an example haptic feedback system with one single drive electrode and one sensing electrode array, according to an embodiment.

FIG. 11 illustrates an example haptic feedback system including two drive electrodes and two sensing electrode arrays, according to an embodiment.

The same reference symbol used in various drawings indicates like elements.

DETAILED DESCRIPTION

Embodiments are disclosed for capacitive sensing systems and methods for sensing mass displacement and direction on one or more movement axes. The capacitive sensing systems can be used in any device that senses object displacement and/or direction, such as, for example, a haptic feedback system used in electronic devices, such as a smartphone, tablet computer, laptop or wearable computer. The capacitive sensing systems include a periodic drive electrode pattern formed on or attached to a movable mass. The periodic drive electrode pattern is positioned relative to a sensing electrode or sensing electrode array so that a dominant capacitance in an overlapping area between the periodic drive electrode pattern and the sensing electrode or sensing electrode array can be sensed by a capacitive sensor. A periodic signal representing the sensed capacitance is generated by the capacitive sensor. The periodic signal has a similar periodic profile (e.g., a sinewave or triangular wave profile) as the periodic drive electrode pattern. If the mass is displaced on a movement axis, a phase shift in the periodic signal reflects the displacement and a sign of the phase shift reflects a direction of the displacement on the movement axis.

In an embodiment, the sensitivity of the periodic signal strength to changes in distance between the drive electrode pattern and the sensing electrode or sensing electrode array is compensated by adding another periodic drive electrode pattern and sensing electrode or sensing electrode arrays to the capacitive sensing system so that when the distance between one set of the electrodes is increasing the distance between the other set of electrodes is decreasing. Both sets of electrodes can be coupled to the same capacitive sensor which is operable to adjust the sensitivity of the signals.

Example Capacitive Sensing System

Figure 1:
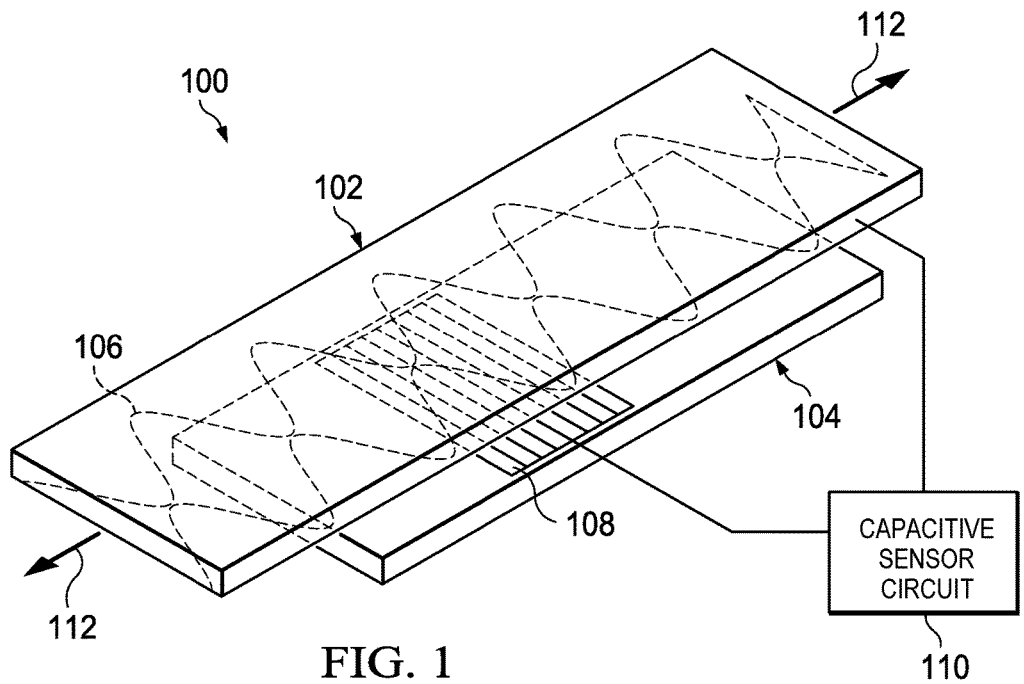
FIG. 1 is a perspective drawing of an example mutual capacitance sensing system for sensing mass displacement and direction, according to an embodiment.
Figure 4:
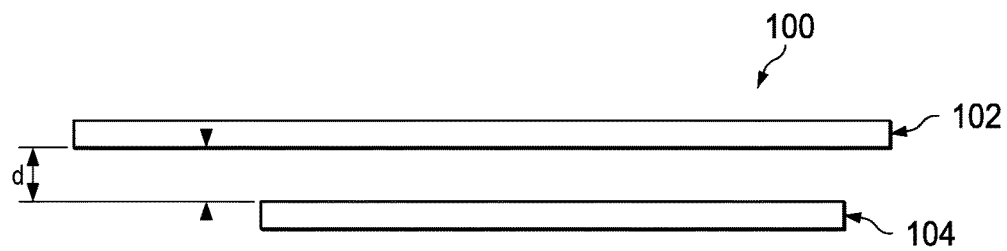
FIG. 4 is a side view of the capacitive sensing systems shown in FIGS. 1 and 2, according to an embodiment.

FIG. 1 is a perspective drawing of an example mutual capacitive sensing system 100 for sensing mass displacement and direction, according to an embodiment. Capacitive sensing system 100 includes mass 102, sensor substrate 104, periodic drive electrode pattern 106, sensing electrode array 108 and capacitive sensor circuit 110 (e.g., a chipset). Mass 102 is operable to move along movement axis 112. In some embodiments, mass 102 is physically constrained by a shaft or other structure to move only along movement axis 112. Periodic drive electrode pattern 106 is disposed on or attached to a surface of mass 102. Mass 102 and sensor substrate 104 are separated by a distance d, as shown in FIG. 4. Mass 102 is positioned relative to sensor substrate 104 so that drive electrode pattern 106 at least partially overlaps at least a portion of sensing electrode array 108. Capacitive sensor circuit 110 is coupled to drive electrode pattern 106 and sensing electrode array 108.

In some embodiments, capacitive sensing system 100 is included in a haptic system. For example, system 100 can be used in a haptic control system that prevents a moving mass or actuator from exceeding certain displacement limits to prevent damage or instability to the haptic system. Capacitive sensing system 100, however, can also be used in any system that senses mass, actuator or object movement.

Figure 2:
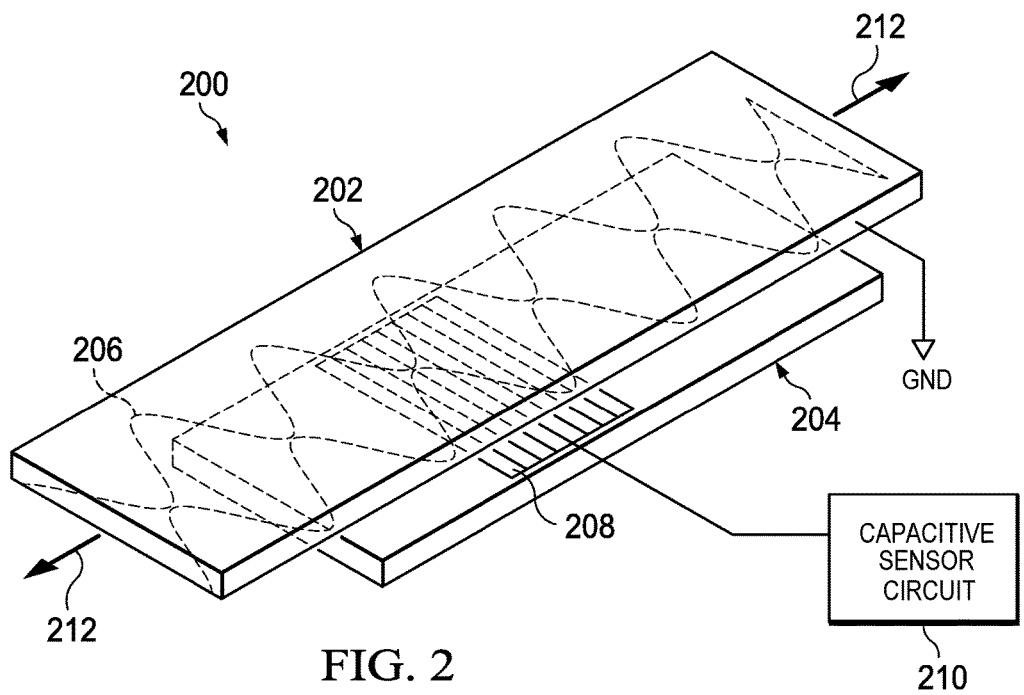
FIG. 2 is a perspective drawing of an example self-capacitance sensing system for sensing mass displacement and direction, according to an embodiment.

FIG. 2 is a perspective drawing of an example self-capacitance sensing system 200 for sensing mass displacement and direction, according to an embodiment. Capacitive sensing system 200 includes mass 202, sensor substrate 204, periodic drive electrode pattern 206, sensing electrode array 208 and capacitive sensor circuit 210. Mass 202 is operable to move along movement axis 212. System 200 is similar to system 100 but operates using the principal of self-capacitance. Only sensing electrode array 208 is coupled to capacitive sensor circuit 210.

Figure 3:
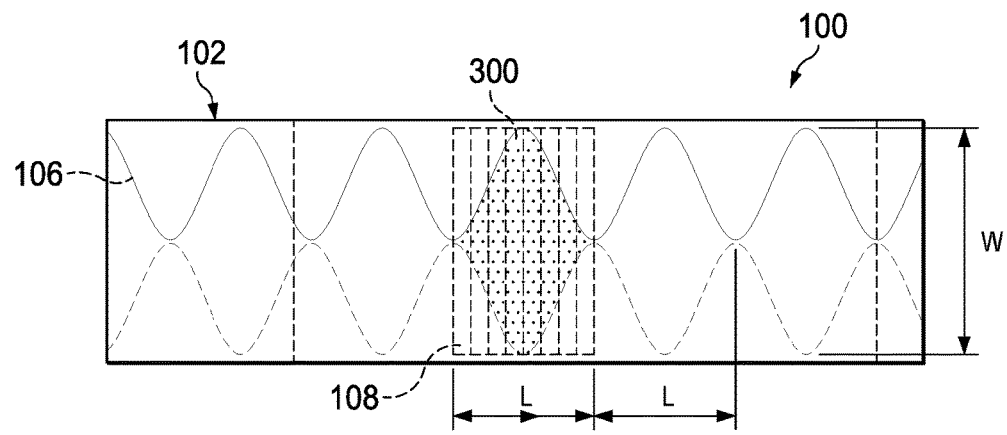
FIG. 3 is a top plan view of an example periodic drive electrode pattern for the capacitive sensing systems shown in FIGS. 1 and 2, according to an embodiment.

FIG. 3 is a top plan view of the example periodic drive electrode pattern 106 shown in FIG. 1, according to an embodiment. In this example embodiment, pattern 106 is a sinewave. Other one-dimensional (1D) and two-dimensional (2D) periodic patterns can be used other than a sinewave, such as a periodic triangle waveform. In some embodiments, a 2D periodic pattern can be used to determine mass displacement and direction along two movement axes as described in reference to FIG. 6B and FIGS. 7B, 7C.

A cycle of periodic drive electrode pattern 106 has a width W/2 and length L. In this example embodiment, sensing electrode array 108 includes N (e.g., N=8) sensing electrodes which collectively span length L, and sensing electrode array 108 has dimensions of L×W. These dimensions allow a cycle of the periodic drive electrode pattern to at least partially overlap with at least some portions of the N sensing electrodes, resulting in a dominant capacitance build up in overlapping area 300.

FIG. 5A illustrates the calculation of mass displacement and direction on a single movement axis using capacitive sensing, according to an embodiment. As shown in FIG. 5A, a cycle of periodic drive electrode pattern 500 has a length L and a width W/2. The capacitance for the ith sensing electrode of a total of N sensing electrodes in a sensing electrode array can be calculated using Equation [1]:

$$C_i = \frac{\varepsilon \int_{x+(i-1)L/N}^{x+iL/N} \left[\frac{W}{2}\sin\left(\frac{2\pi x}{L} - \frac{\pi}{2}\right) + \frac{w}{2}\right] \cdot dx}{d}, \quad [1]$$

where d is the distance between the drive electrode pattern and the ith sensing electrode as shown in FIG. 4 and $\varepsilon$ is the permittivity of dielectric. The capacitance in Equation [1] is calculated by integrating overlapping area 502 for each of the N sensing electrodes.

FIG. 5B shows two periodic signal plots for two different positions of the mass on a single movement axis x. In this example, the sensing electrode array includes 8 sensing electrodes (N=8). A first signal plot 504 is shown for a first position $x_o$ on movement axis x that is determined at a first time $t_0$ using Equation [1]. A second plot 506 is shown for position $x_1$ on the movement axis x that is determined at a second time $t_1$ after the first time $t_0$ using Equation [1]. Assuming that the mass was displaced during the time interval $t_1$-$t_0$, the displacement $x_1$-$x_0$ of the mass on the movement axis x is given by Equation [2]:

$$x_1 = x_0 - \frac{\Delta\varphi}{2\pi}L, \quad [2]$$

where $\Delta\varphi$ is a phase shift between the two periodic signals for the two positions. Accordingly, the displacement of the mass on movement axis x is proportional to the phase shift $\Delta\varphi$ between the periodic signals. Additionally, the sign of the phase shift indicates the direction of displacement on the movement axis x.

Figure 6A:
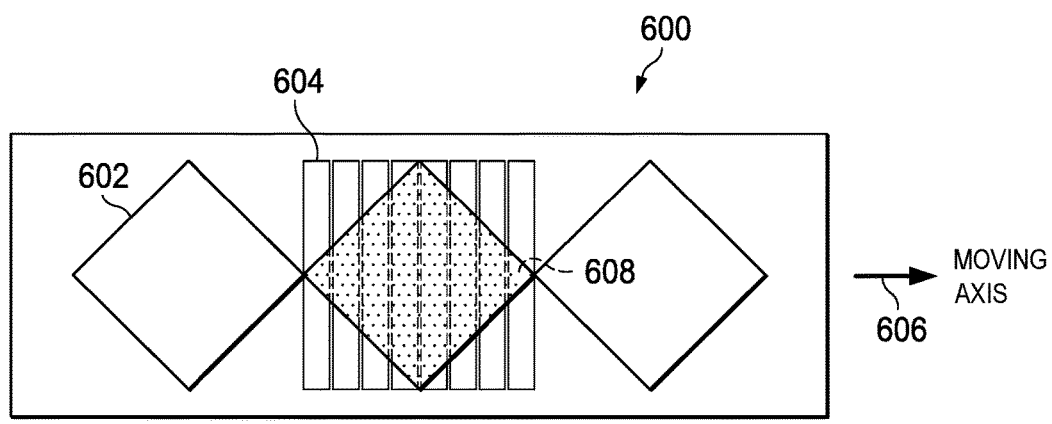
FIG. 6A illustrates an example alternative design for a periodic drive electrode pattern for single axis sensing, according to an embodiment.
Figure 7A:
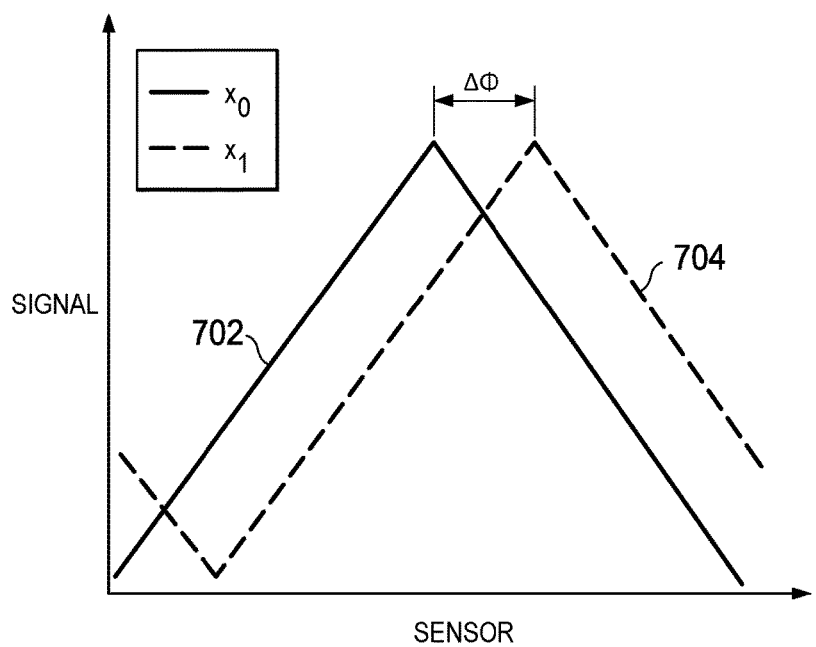
FIG. 7A illustrates an example phase shift calculation for the periodic pattern shown in FIG. 6A, according to an embodiment.

FIGS. 6A and 7A illustrate a periodic drive electrode sensor pattern and phase shift calculation, respectively for a single movement axis 606, according to an embodiment. Referring to FIG. 6A, periodic drive electrode pattern 602 is disposed on movable mass 600, creating an overlapping area 608 with sensing electrode array 604. In this example, a periodic triangle waveform is used rather than a sinewave. The capacitance for the ith sensing electrode can be given by Equation [3]:

$$C_i = \frac{\varepsilon \int_{x+(i-1)L/N}^{x+iL/N} f(x) \cdot dx}{d}, \quad [3]$$

where $f(x) = \frac{Wx}{L}$, for $0 \le x < L/2$ and $f(x) = \frac{-Wx}{L} + 2W$, for $L/2 \le x < L$.

FIG. 7A corresponds to FIG. 6A and shows two periodic signal plots for two different positions of the mass on the movement axis x. A first signal plot 702 is shown for position $x_o$ that is determined at a first time $t_0$ using Equation [3] and assuming a sensing electrode array with 8 sensing electrodes. A second signal plot 704 is shown for position $x_1$ that is determined at a second time $t_1$ after the first time $t_0$ using Equation [3]. Assuming that the mass moved during the time interval $t_1$-$t_0$, the displacement $x_1$-$x_0$ of the mass on the movement axis x is given by Equation [2].

Figure 6B:
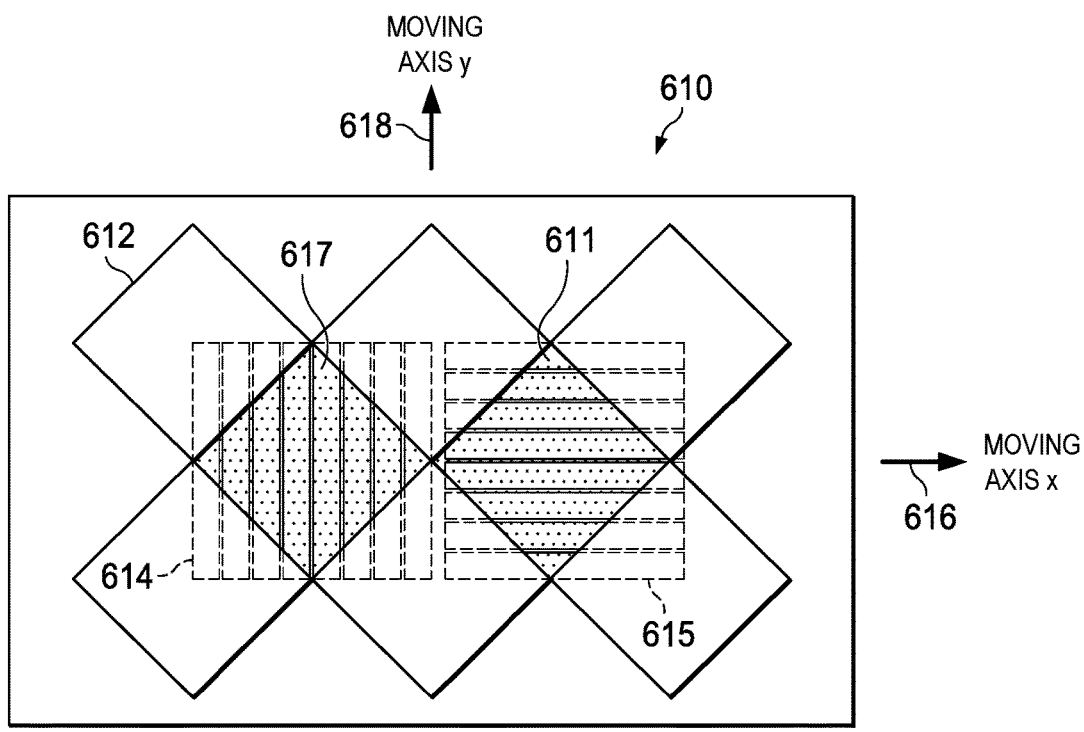
FIG. 6B illustrates an example alternative design for a periodic drive electrode pattern two axis sensing, according to an embodiment

FIG. 6B illustrates a periodic drive electrode pattern for a two-axis sensor, according to an embodiment. A 2D periodic drive electrode pattern 612 disposed on movable mass 610 creates an overlapping area 617 with sensing electrode array 614 and an overlapping area 611 with sensing electrode array 615. Sensing electrode array 615 is rotated Ω degrees (e.g., 90° clockwise) relative to sensing electrode array 614. However, the sensing electrode arrays 614, 615 can be oriented with respect to each other at any desired angle. With the 2D pattern 612 and arrangement of sensing arrays 614, 615, capacitive measurements can be made for determining the displacement and direction of a mass on two orthogonal movement axes 616, 618.

Figure 7B:
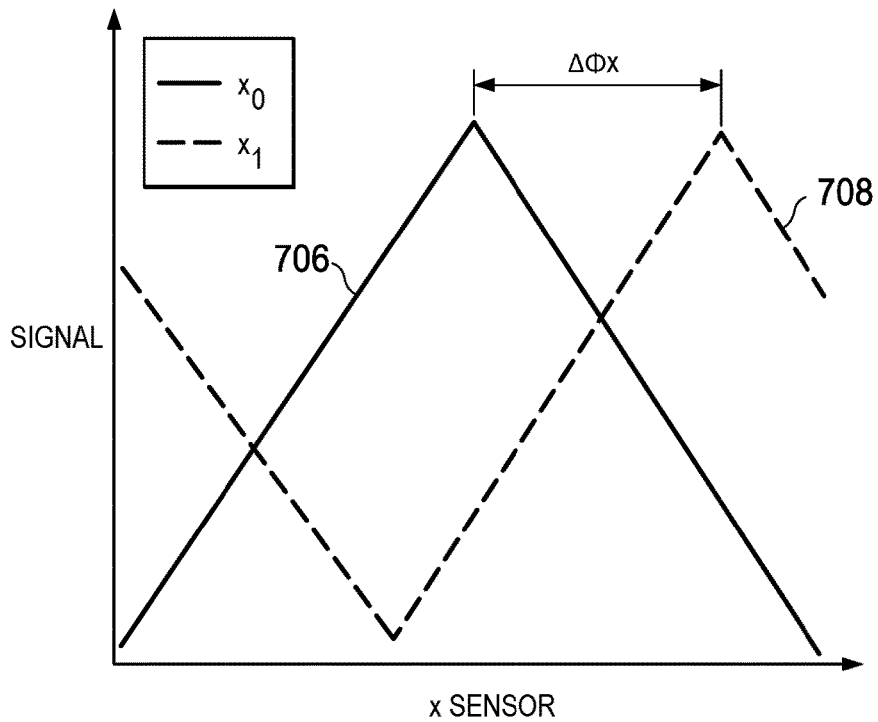
FIGS. 7B and 7C illustrate example phase shift calculations for the periodic pattern shown in FIG. 6B, according to an embodiment.

FIG. 7B corresponds to FIG. 6B and shows two periodic signal plots for two different positions of the movable mass on the movement axis x. A first signal plot 706 is shown for position $x_o$ that is determined at a first time $t_0$ using a variation of Equation [3], assuming a sensing electrode array with 8 sensing electrodes. A second signal plot 708 is shown for position $x_1$ that is determined at a second time $t_1$ after the first time $t_0$ using Equation [3]. Assuming that the mass moved during the time interval $t_1$-$t_0$, the displacement traveled $x_1$-$x_0$ by the mass along the movement axis x is given by Equation [2].

Figure 7C:
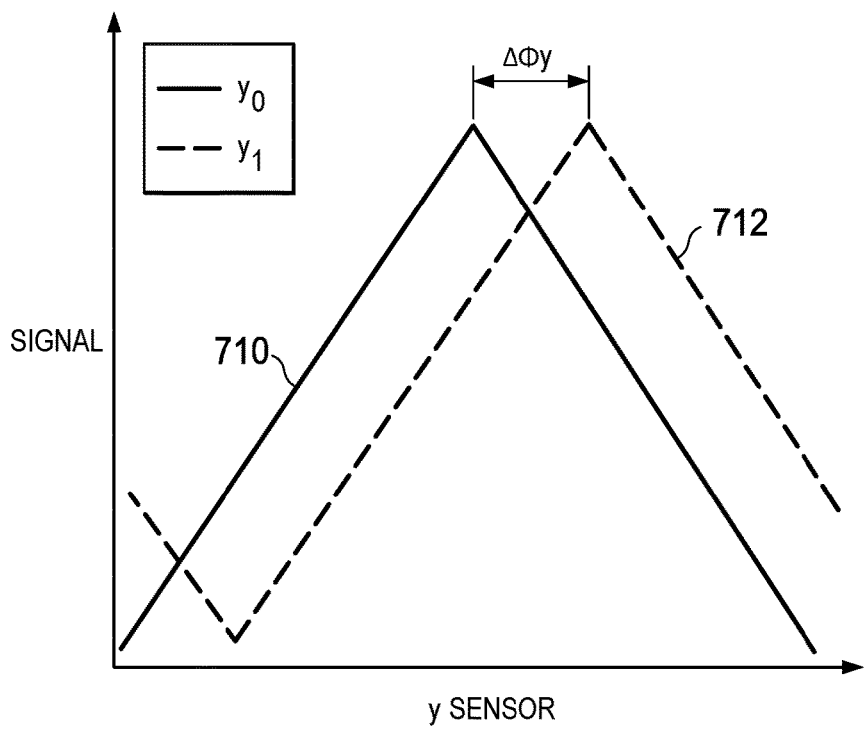

FIG. 7C also corresponds to FIG. 6B and shows two signal plots for two different positions of the movable mass on the movement axis y. A first signal plot 710 is shown for position $y_o$ that is determined at a first time $t_0$ using Equation [3], assuming a sensing electrode array with 8 sensing electrodes. A second signal plot 712 is shown for position $y_1$ that is determined at a second time $t_1$ after the first time $t_0$ using Equation [3]. Assuming that the mass moved during the time interval $t_1$-$t_0$, the displacement $y_1$-$y_0$ of the mass on the movement axis y is given by Equation [2].

Figure 8:
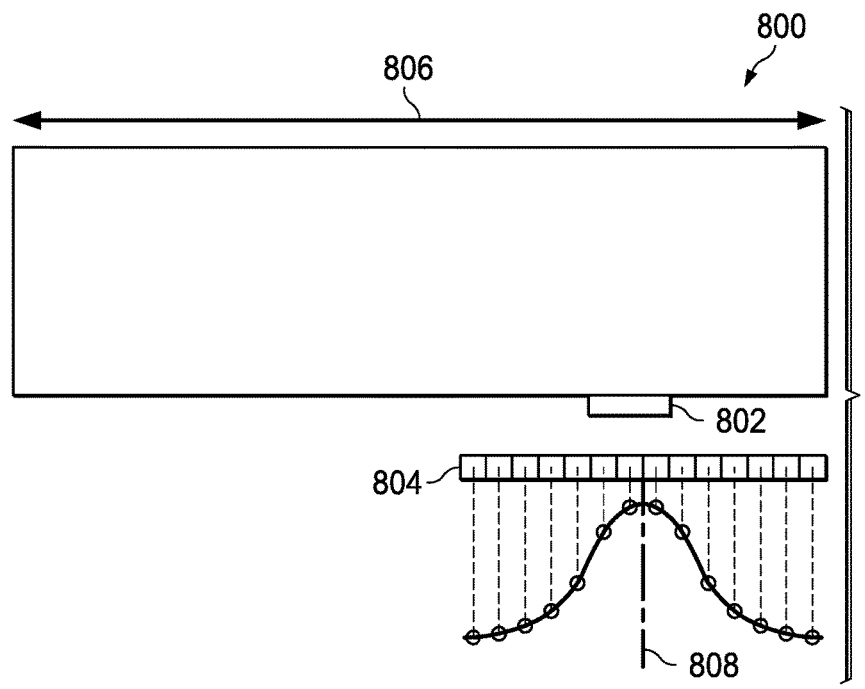
FIG. 8 illustrates an example alternative embodiment for a capacitive sensing system for sensing mass displacement and direction using a mutual capacitance sensing electrode array, according to an embodiment.

FIG. 8 illustrates an alternative embodiment for a capacitive sensing system for sensing object movement using a mutual capacitance sensing electrode array, according to an embodiment. In this embodiment, mass 800 can move along movement axis 806 in either direction. Drive electrode 802 is attached to mass 800 and overlaps sensing electrode array 804. In this arrangement the dominant capacitance will be directly under drive electrode 802. Capacitance measurements are taken at the sensing electrodes of sensing electrode array 804 and a location of a centroid 808 representing the peak capacitance is determined. If during a time interval $t_1$-$t_0$, mass 800 moves along movement axis 806, the centroid location will shift. The difference between centroid locations at times $t_0$ and $t_1$ is proportional to the displacement moved by mass 800 along movement axis 806. In an embodiment, tracking the centroid 808 can be implemented as follows. The x-axis number for each sensing electrode in sensing electrode array 804 is $x_i$=(i−1)*L/N+0.5*L/N (center of sensing electrode) and the signal at a certain location of mass 800 on the x-axis for each sensing electrode is $s_i$. Then the x-coordinate of the peak point or centroid 808 ($x_p$, $y_p$) can be obtained by interpolating $x_i$ and $s_i$. If $x_{p0}$ is the $t_0$ position reading of mass 800, and $x_{p1}$ is the $t_1$ position reading of mass 800, the displacement of mass 800 is $x_{p1}$-$x_{p0}$. An advantage of this embodiment is the drive electrode 802 is simple and less space is needed for the capacitive sensing system.

Figure 9:
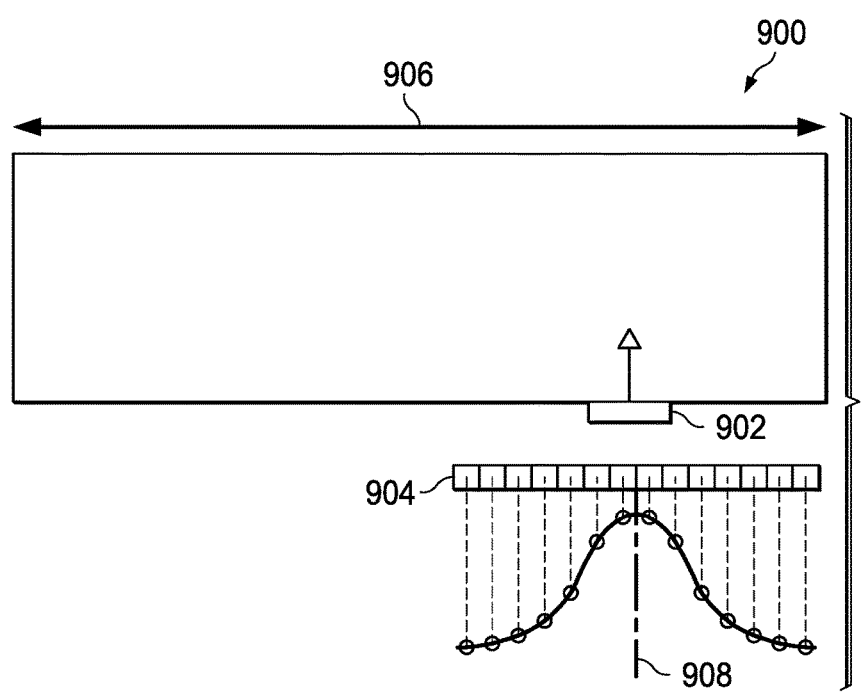
FIG. 9 illustrates an example alternative embodiment for a capacitive sensing system for sensing mass displacement and direction using a self-capacitance sensing electrode array, according to an embodiment.

FIG. 9 illustrates an alternative embodiment for a capacitive sensing system for sensing object movement using a self-capacitance sensing electrode array, according to an embodiment. Note that the drive electrode 902 is coupled to ground for self-capacitance. In this embodiment, mass 900 can move along movement axis 906 in either direction. Drive electrode 902 is attached to mass 900 and overlaps sensing electrode array 904. In this arrangement the dominant capacitance will be directly under drive electrode 902. Capacitance measurements are taken at the sensing electrodes of sensing electrode array 904 and a centroid 908 is determined that represents the peak capacitance. If during a time interval $t_1$-$t_0$, mass 900 moves along movement axis 906, the centroid location will shift. The difference between centroid locations at times $t_0$ and $t_1$ is proportional to the displacement moved by mass 900 on movement axis 906. Centroid 908 can be determined in a similar manner as centroid 808 as described in reference to FIG. 8.

FIG. 10 illustrates an example haptic system 1000 including a single drive electrode and a single sensing electrode array. Haptic system 1000 includes movable mass 1006, shaft 1008, drive electrode 1002, sensing electrode 1004 and springs 1010, 1012. A capacitive sensing circuit is included on sensing electrode 1004. All of these components are located within housing 1016. Flexible circuit 1014 connects drive electrode 1002 to sensing electrode array 1004. Sensing electrode array 1004 is coupled to an external motor controller. Haptic system 1000 is environment robust, easy to implement and cost effective. The capacitive sensing system used by haptic feedback system 1000 does not require a sealed environment to prevent rust, light or other leakage. The capacitive sensing system does not require a special mass design.

FIG. 11 illustrates an example haptic system 1100 including two drive electrodes and two sensing electrode arrays, according to an embodiment. Haptic system 1100 includes mass 1106, drive electrodes 1102a, 1102b, sensing electrode arrays 1104a, 1104b, springs 1110, 1112 and analog front end (AFE) 1116. Using two sensing electrode arrays 1104a, 1104b allows for compensation of variations in the distances $d_1$ and $d_2$. Sensing electrode arrays 1104a, 1104b are each coupled to AFE 1116 which is operable to provide the compensation of the variations in the distances $d_1$ and $d_2$. Haptic system 1100 is environment robust, easy to implement and cost effective. The capacitive sensing system used by haptic feedback system 1100 does not require a sealed environment to prevent rust, light or other leakage. The capacitive sensing system does not require a special mass design. As the mass vibrates in a vertical direction, the value of distances d1 and d2 will change in opposite directions but the sum of d1 and d2 will remain constant. Since the total capacitance is $$C_{tot} = \varepsilon \frac{S}{d1} + \varepsilon \frac{S}{d2},$$

the total capacitance will not decrease due to mass vertical movement. This is not the case with only one set of electrodes. AFE 1116 will get a higher signal-to-noise ratio (SNR), and the position calculated by Equation [2] is more accurate. The ith electrode from sensing electrode array 1104a can be connected to the ith electrode from sensing electrode array 1104b so that only one AFE 1116 is required.

Example Capacitive Sensing Process

Figure 12:
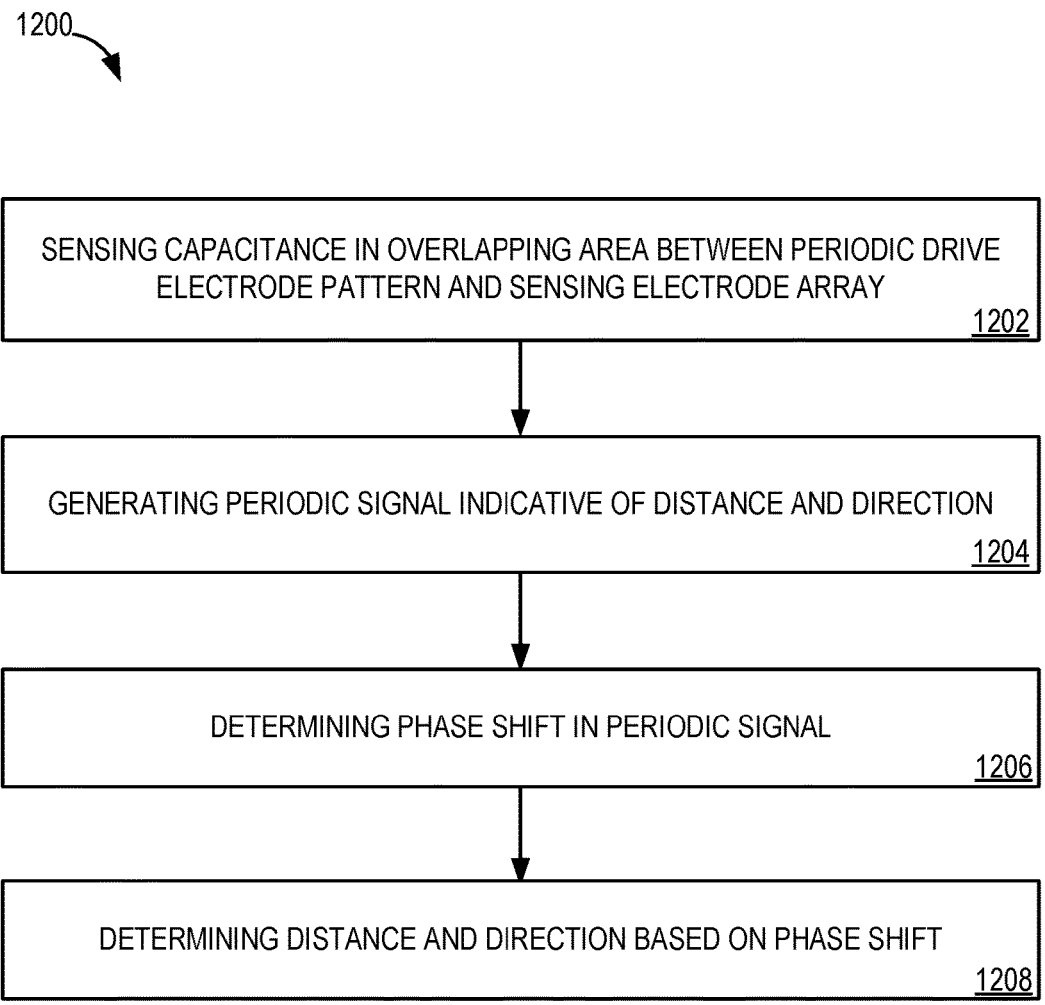
FIG. 12 is a flow diagram of an example capacitive sensing process for sensing mass movement and direction, according to an embodiment.

FIG. 12 is a flow diagram of an example capacitive sensing process 1200 for sensing mass movement and direction, according to an embodiment. Process 1200 can be implemented by mobile device architecture 1300, as described in reference to FIG. 13.

In some embodiments, process 1200 can begin by sensing capacitance (e.g., sense a dominant capacitance) in one or more overlapping areas between one or more periodic drive electrode patterns disposed on a movable mass and one or more sensing electrodes or sensing electrode arrays (1202). For example, the periodic drive electrode pattern can be a 1D or 2D sinewave or a periodic triangle waveform. Process 1200 can continue by generating one or more periodic signals based on the capacitances measured on one or more sensing electrodes of the one or more sensing electrode arrays in the overlapping area (1204). Process 1200 can continue by determining one or more phase shifts of the periodic signals due to movement of the mass on one or more movement axes (1206). Process 1200 can continue by determining, based on the one or more phase shifts, a displacement and direction of the mass on one or more movement axes (1208). For example, the magnitude of the phase shift indicates a displacement of the mass on the movement axis and the sign of the phase shift indicates the direction of mass on the movement axis.

Example Device Architecture

Figure 13:
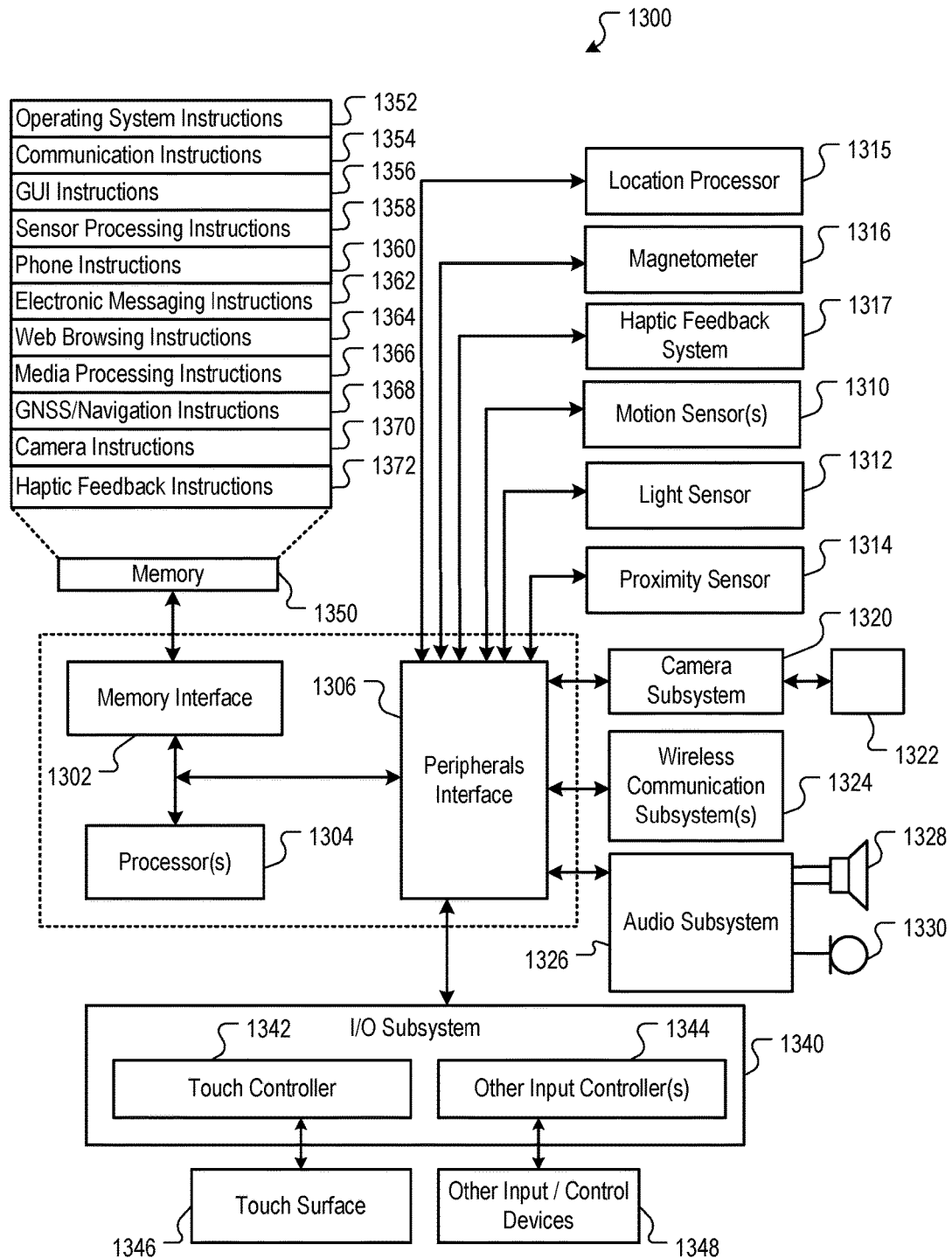
FIG. 13 is a block diagram of an example device architecture for implementing the capacitive sensing systems described in reference to FIGS. 1-12.

FIG. 13 is a block diagram of an example device architecture for implementing the capacitive sensing systems described in reference to FIGS. 1-12, according to an embodiment. Architecture 1300 may be implemented in any mobile device for generating the features and processes described in reference to FIGS. 1-12, including but not limited to smart phones and wearable computers (e.g., smart watches, fitness bands). Architecture 1300 may include memory interface 1302, data processor(s), image processor(s) or central processing unit(s) 1304, and peripherals interface 1306. Memory interface 1302, processor(s) 1304 or peripherals interface 1306 may be separate components or may be integrated in one or more integrated circuits. One or more communication buses or signal lines may couple the various components.

Sensors, devices, and subsystems may be coupled to peripherals interface 1306 to facilitate multiple functionalities. For example, motion sensor(s) 1310, light sensor 1312, and proximity sensor 1314 may be coupled to peripherals interface 1306 to facilitate orientation, lighting, and proximity functions of the device. For example, in some embodiments, light sensor 1312 may be utilized to facilitate adjusting the brightness of touch surface 1346. In some embodiments, motion sensor(s) 1310 (e.g., an accelerometer, rate gyroscope) may be utilized to detect movement and orientation of the device. Accordingly, display objects or media may be presented according to a detected orientation (e.g., portrait or landscape). Haptic feedback system 1317, under the control of haptic feedback instructions 1372, provides the features and performs the processes described in reference to FIGS. 1-12, such as, for example, implementing a capacitive sensing system. Haptic feedback system 1317 can include an input surface and one or more actuators, such as piezoelectric transducers, electromechanical devices, and/or other vibration inducing devices, that are mechanically connected to the input surface. Drive electronics coupled to the one or more actuators cause the actuators to induce a vibratory response into the input surface, providing a tactile sensation to a user touching or holding the device.

Other sensors may also be connected to peripherals interface 1306, such as a temperature sensor, a barometer, a biometric sensor, or other sensing device, to facilitate related functionalities. For example, a biometric sensor can detect fingerprints and monitor heart rate and other fitness parameters.

Location processor 1315 (e.g., GNSS receiver chip) may be connected to peripherals interface 1306 to provide georeferencing. Electronic magnetometer 1316 (e.g., an integrated circuit chip) may also be connected to peripherals interface 1306 to provide data that may be used to determine the direction of magnetic North. Thus, electronic magnetometer 1316 may be used as an electronic compass.

Camera subsystem 1320 and an optical sensor 1322, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 1324. Communication subsystem(s) 1324 may include one or more wireless communication subsystems. Wireless communication subsystems 1324 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and embodiment of the communication subsystem 1324 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network. Wireless communication subsystems 1324 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 1326 may be coupled to a speaker 1328 and one or more microphones 1330 to facilitate voice-enabled functions, such as voice recognition, voice replication, digital recording, and telephony functions.

I/O subsystem 1340 may include touch controller 1342 and/or other input controller(s) 1344. Touch controller 1342 may be coupled to a touch surface 1346. Touch surface 1346 and touch controller 1342 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 1346. In one embodiment, touch surface 1346 may display virtual or soft buttons and a virtual keyboard, which may be used as an input/output device by the user.

Other input controller(s) 1344 may be coupled to other input/control devices 1348, such as one or more buttons, rocker switches, thumb-wheel, infrared port, USB port, and/or a pointer device such as a stylus. The one or more buttons (not shown) may include an up/down button for volume control of speaker 1328 and/or microphone 1330.

In some embodiments, device 1300 may present recorded audio and/or video files, such as MP3, AAC, and MPEG video files. In some embodiments, device 1300 may include the functionality of an MP3 player and may include a pin connector for tethering to other devices. Other input/output and control devices may be used.

Memory interface 1302 may be coupled to memory 1350. Memory 1350 may include high-speed random access memory or non-volatile memory, such as one or more magnetic disk storage devices, one or more optical storage devices, or flash memory (e.g., NAND, NOR). Memory 1350 may store operating system 1352, such as Darwin, RTXC, LINUX, UNIX, OS X, iOS, WINDOWS, or an embedded operating system such as VxWorks. Operating system 1352 may include instructions for handling basic system services and for performing hardware dependent tasks. In some embodiments, operating system 1352 may include a kernel (e.g., UNIX kernel).

Memory 1350 may also store communication instructions 1354 to facilitate communicating with one or more additional devices, one or more computers or servers, including peer-to-peer communications. Communication instructions 1354 may also be used to select an operational mode or communication medium for use by the device, based on a geographic location (obtained by the GPS/Navigation instructions 1368) of the device.

Memory 1350 may include graphical user interface instructions 1356 to facilitate graphic user interface processing, including a touch model for interpreting touch inputs and gestures; sensor processing instructions 1358 to facilitate sensor-related processing and functions; phone instructions 1360 to facilitate phone-related processes and functions; electronic messaging instructions 1362 to facilitate electronic-messaging related processes and functions; web browsing instructions 1364 to facilitate web browsing-related processes and functions; media processing instructions 1366 to facilitate media processing-related processes and functions; GNSS/Navigation instructions 1368 to facilitate GNSS (e.g., GPS, GLOSSNAS) and navigation-related processes and functions; camera instructions 1370 to facilitate camera-related processes and functions; and haptic feedback instructions 1372 for commanding or controlling haptic feedback system 1317 and to provide the features and performing the processes described in reference to FIGS. 1-12.

Each of the above identified instructions and applications may correspond to a set of instructions for performing one or more functions described above. These instructions need not be implemented as separate software programs, procedures, or modules. Memory 1350 may include additional instructions or fewer instructions. Furthermore, various functions of the device may be implemented in hardware and/or in software, including in one or more signal processing and/or application specific integrated circuits (ASICs).

A number of embodiments have been described. Nevertheless, it will be understood that various modifications may be made. Elements of one or more embodiments may be combined, deleted, modified, or supplemented to form further embodiments. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A capacitive sensing system for sensing mass displacement and direction, the system comprising:
    a mass;
    a periodic drive electrode pattern formed on or attached to the mass;
    a sensing electrode array positioned relative to the periodic drive electrode pattern, the sensing electrode array operable to sense a capacitance in an overlapping area between the periodic drive electrode pattern and the sensing electrode array; and
    a capacitive sensing circuit coupled to at least the sensing electrode array, the capacitive sensing circuit operable to:
        generate at a first time a first periodic signal based on the sensed capacitance;
        generate at a second time after the first time, a second periodic signal based on the sensed capacitance;
        determine a phase shift between the first and second periodic signals; and
        determine, based on the phase shift, a displacement and direction of the mass on a movement axis.

2. The capacitive sensing system of claim 1, wherein the periodic drive electrode pattern has a sinewave profile.

3. The capacitive sensing system of claim 1, wherein the periodic drive electrode pattern has a triangle waveform profile.

4. The capacitive sensing system of claim 1, wherein the sensing electrode array is a self-capacitance sensing electrode array.

5. The capacitive sensing system of claim 1, wherein the first and second periodic signals are generated by integrating the sensed capacitance at each sensing electrode in the sensing electrode array.

6. A method comprising:
    sensing, by a sensing electrode array, capacitance in an overlapping area between a drive electrode or a periodic drive electrode pattern formed on or attached to a mass and at least one sensing electrode array;
    generating at a first time a first periodic signal indicative of mass motion;
    generating at a second time after the first time, a second periodic signal indicative of mass motion;
    determining a phase shift between the first and second periodic signals; and
    determining, based on the phase shift, at least one displacement and at least one direction of the mass on at least one movement axis.

7. The method of claim 6, wherein the periodic drive electrode pattern is formed on or attached to the mass and the periodic drive electrode pattern has a sinewave profile.

8. The method of claim 6, wherein the periodic drive electrode pattern is formed on or attached to the mass and the periodic drive electrode pattern has a triangle waveform profile.

9. The method of claim 6, wherein the at least one sensing electrode array is a self-capacitance sensing electrode array.

10. The method of claim 6, wherein the first and second periodic signals are generated by integrating the sensed capacitance for each sensing electrode in the sensing electrode array.

11. A capacitive sensing system for sensing mass displacement and direction, the system comprising:
    a mass having a surface with a two-dimensional periodic drive electrode pattern formed on or attached to the surface;
    a first sensing electrode array positioned relative to the periodic drive electrode pattern, the first sensing electrode array operable to sense a first capacitance associated with a first overlapping area between the periodic drive electrode pattern and the first sensing electrode array;
    a second sensing electrode array positioned relative to the periodic drive electrode pattern, the second sensing electrode array operable to sense a second capacitance associated with a second overlapping area between the periodic drive electrode pattern and the second sensing electrode array; and
    a capacitive sensing circuit coupled to the first and second sensing electrode arrays, the capacitive sensing circuit operable to:
        generate at a first time a first set of periodic signals based on the first sensed capacitance;
        determine a first phase shift between the first set of periodic signals;
        generate at a second time after the first time, a second set of periodic signals based on the second sensed capacitance;
        determine a second phase shift between the second set of periodic signals; and
        determine, based on the first and second phase shifts, displacements and directions of the mass on two or more movement axes.

12. The capacitive sensing system of claim 11, wherein at least one of the first and second sensing electrode arrays is a self-capacitance sensing electrode array.

13. The capacitive sensing system of claim 11, wherein the first second sets of periodic signals are generated by integrating the sensed capacitance for each sensing electrode in at least one sensing electrode array.

14. The capacitive sensing system of claim 11, wherein the capacitive sensing circuit is operable to compensate for changes in a distance between the periodic drive electrode pattern and the first and second sensing electrode arrays.

15. A capacitive sensing system for sensing mass movement and direction, the system comprising:
    a movable mass;
    a drive electrode formed on or attached to the mass;
    a sensing electrode array positioned relative to the drive electrode and operable to sense capacitance in an overlapping area between the drive electrode and the sensing electrode array; and
    a capacitive sensor coupled to the sensing electrode array and operable to:
        determine at a first time a first centroid of a first capacitance distribution across a number of sensing electrodes of the sensing electrode array;

determine at a second time after the first time, a second centroid of a second capacitance distribution across the number of sensing electrodes of the sensing electrode array;

compute a shift in locations of the first and second centroids along the sensing electrode array; and determine, based on the centroid shift, a displacement and direction of the mass on a movement axis.

16. The capacitive sensing system of claim 15, wherein the sensing electrode array is a self-capacitance sensing electrode array.

17. A haptic system comprising:

a housing;

a movable mass fixed in the housing and operable to move within the housing on a movement axis, one or more drive electrodes or periodic drive electrode patterns formed on or attached to the mass;

one or more sensing electrode arrays positioned in the housing relative to the drive electrode or drive periodic electrode pattern, the one or more sensing electrode arrays operable to sense capacitance in one or more overlapping areas between the drive electrode or periodic drive electrode pattern and the one or more sensing electrode arrays; and a capacitive sensing circuit coupled to at least one of the sensing electrode arrays, the capacitive sensing circuit operable to:

generate at a first time a first set of one or more periodic signals based on the sensed capacitance;

generate at a second time after the first time, a second set of one or more periodic signals based on the sensed capacitance;

determine one or more phase shifts between the first and second sets of one or more signals; and determine, based on the one or more phase shifts, a displacement and direction of the mass on one or more movement axes.

18. The haptic system of claim 17, wherein at least one sensing electrode array is a self-capacitance sensing electrode array.

19. The haptic system of claim 17, wherein the first and second sets of one or more periodic signals are generated by integrating the sensed capacitance for each sensing electrode in at least one sensing electrode array.

20. The haptic system of claim 17, wherein the capacitive sensing circuit is operable to compensate for changes in a distance between periodic drive electrode pattern and the at least one sensing electrode array.

* * * * *

UNITED STATES PATENT AND TRADEMARK OFFICE
CERTIFICATE OF CORRECTION

PATENT NO. : 10,345,973 B2
APPLICATION NO. : 15/209692
DATED : July 9, 2019
INVENTOR(S) : Mengshu Huang et al.

It is certified that error appears in the above-identified patent and that said Letters Patent is hereby corrected as shown below:

In the Claims

Column 12, Line 48, In Claim 13, after "first" insert -- and --.

Signed and Sealed this
Thirty-first Day of March, 2020

Andrei Iancu
*Director of the United States Patent and Trademark Office*